United States Patent
Kim et al.

(10) Patent No.: US 7,549,769 B2
(45) Date of Patent: Jun. 23, 2009

(54) LED LENS FOR BACKLIGHT

(75) Inventors: Jin Jong Kim, Suwon-si (KR); Ho Seop Jeong, Seongnam-si (KR)

(73) Assignee: Samsung Electro-Mechanics Co., Ltd., Gyonggi-Do (KR)

( * ) Notice: Subject to any disclaimer, the term of this patent is extended or adjusted under 35 U.S.C. 154(b) by 142 days.

(21) Appl. No.: 11/511,420

(22) Filed: Aug. 29, 2006

(65) Prior Publication Data

US 2007/0047232 A1 Mar. 1, 2007

(30) Foreign Application Priority Data

Aug. 30, 2005 (KR) .................... 10-2005-0080045

(51) Int. Cl.
*F21V 1/00* (2006.01)
(52) U.S. Cl. .................. 362/241; 362/299; 362/245; 362/244; 362/291
(58) Field of Classification Search ............... 362/241, 362/244, 235, 246, 291, 299, 308, 310, 326, 362/329, 335, 336, 346, 509, 561, 305, 555, 362/327, 245; 359/708, 711, 712; 257/98–100
See application file for complete search history.

(56) References Cited

U.S. PATENT DOCUMENTS

| | | | |
|---|---|---|---|
| 6,679,621 B2 | 1/2004 | West et al. | |
| 6,724,543 B1 * | 4/2004 | Chinniah et al. | 359/718 |
| 6,974,229 B2 * | 12/2005 | West et al. | 362/227 |
| 2002/0160553 A1 * | 10/2002 | Yamanaka et al. | 438/149 |
| 2005/0093014 A1 * | 5/2005 | Seki et al. | 257/100 |
| 2006/0105485 A1 * | 5/2006 | Basin et al. | 438/27 |
| 2006/0139918 A1 * | 6/2006 | Dolgin et al. | 362/232 |

FOREIGN PATENT DOCUMENTS

| | | |
|---|---|---|
| JP | 2003-8081 A | 1/2003 |
| JP | 2004-234888 A | 8/2004 |

* cited by examiner

*Primary Examiner*—Ali Alavi
*Assistant Examiner*—Evan Dzierzynski
(74) *Attorney, Agent, or Firm*—McDermott Will & Emery LLP

(57) ABSTRACT

Disclosed herein is a Light Emitting Diode (LED) lens for a backlight. The LED lens includes an LED light source, a lens body, and a beam shaping element. The lens body is configured such that the LED light source is accommodated in the lower portion thereof, and light emitted from the LED light source is radiated in vertical and lateral directions of the lens body. The beam shaping element is fastened to the top of the lens body and is configured to adjust light beams radiated through the upper surface of the lens body. Accordingly, the uniformity of luminance and color can be increased and, at the same time, the overall performance of the system can be improved.

10 Claims, 5 Drawing Sheets

LED LENS FOR BACKLIGHT

BACKGROUND OF THE INVENTION

1. Field of the Invention

The present invention relates generally to a light emitting diode lens for a backlight and, more particularly, to a light emitting diode lens for a backlight, which radiates light, emitted from a light emitting diode light source, in lateral and vertical directions of a lens body, thus improving the uniformity of luminance and color in the overall system to which the LED lens is applied.

2. Description of the Related Art

Recently, in a display device and an illumination optical system, demands for a light source having environment-friendliness, high efficiency and a long lifespan are increasing. Furthermore, as the efficiency and luminance of a Light Emitting Diode (LED) are increasing continuously, an alternative light source using an LED has been developed and is gradually being applied to the display device and the illumination optical system. In particular, as projects, such as the development of an environment-friendly TeleVison (TV), are published, research into an LCD display device using an LED light source continues to advance. In order to meet such technical demands, the need for the development of a more efficient type of LED lens (or a lens for an LED light source) for a light source for the display device and the illumination optical system is further increasing.

FIG. 1 shows an example of a conventional side radiation-type LED lens, the details of which have been described in U.S. Pat. No. 6,679,621. The LED lens of FIG. 1, which is called a side radiation-type LED lens, is characterized in that it includes a reflecting surface and a refracting surface, and is configured such that light emitted from an LED is radiated through the side surface (refracting surface) of the lens.

The lens 20 of FIG. 1 is constructed to accommodate an LED 10 in the lower portion thereof, and includes a lower refracting surface 22, an upper refracting surface 24 connected to the lower refracting surface, and an upper reflecting surface 26. The upper reflecting surface 26 is symmetrical with respect to a central axis C and forms a predetermined angle, so that all of the light oriented in a vertical direction of the lens is reflected.

That is, as indicated by reference characters L1 and L2 in FIG. 1, the light emitted from the LED light source 10 is directly radiated in a lateral direction through the lower refracting surface 22. Furthermore, light oriented in the vertical direction is reflected in a Total Inner Reflection (TIR) fashion by the upper reflecting surface 26 and is then radiated in the lateral direction through the upper refracting surface 24.

However, although the LED lens having the above-described structure was designed with the goal of radiating all of the light in the lateral direction, there are light beams radiated through the upper surface of the lens, as indicated by reference characters L3 and L4 in FIG. 1. This phenomenon occurs because the lens has been designed under the condition that the LED light source accommodated in the lens is a point light source and, therefore, light, which is emitted from regions other than the focal point F of the LED light source, passes through the upper reflecting surface without being reflected therefrom. This light results in erroneous light in the lens. Such erroneous light degrades the performance of the overall system and the uniformity of color and luminance, therefore it may act as a factor that can increase the thickness of the overall system.

Furthermore, in the above-described side-emitting lens, most of the light beams are radiated in the lateral direction of the lens (that is, in the direction perpendicular to the display plane), so that a medium (for example, the internal reflecting plate of the backlight) for changing the path of light is required such that the light radiated in the lateral direction is directed toward the display plane. This can also degrade the overall performance of the light.

FIG. 2 shows another example of a conventional upper-emitting LED lens. In accordance with FIG. 2, the conventional upper-emitting LED lens is basically characterized in that LED light sources 32 are located at the center portion of a flat-shaped light guide plate 30, light emitted from the LED light source 32 is primarily reflected, is reflected again by a predetermined pattern 34 formed in the lower surface on the light guide plate, and is then radiated through the upper surface 36 (display surface) of the light guide plate 36.

That is, the upper-emitting LED lens of FIG. 2 is characterized in that the direction of the light, which is emitted from the LED light source, and the display direction are arranged parallel to each other, so that the light can be uniformly radiated.

However, although, in such a scheme, improvement in the efficiency of the overall system may be expected, there is a problem in which luminance variation among individual light sources causes non-uniformity of the overall system because the backlight system is not constructed using only a single light source. That is, in a system in which a single light source is used, the overall uniformity of the luminance thereof can be easily ensured. In contrast, in a system in which a plurality of LED light sources is arranged, a problem occurs in that the overall luminance is non-uniform because the light beams emitted from respective light sources overlap or have spacing intervals therebetween.

SUMMARY OF THE INVENTION

Accordingly, the present invention has been made keeping in mind the above problems occurring in the prior art, and an object of the present invention is to provide an LED lens for a backlight, which has a structure in which light is radiated in vertical and lateral directions of a lens body.

Another object of the present invention is to provide an LED lens for a backlight, which can ensure the overall uniformity of luminance and color in a system in which a plurality of LED lenses is provided.

In order to accomplish the above objects, the present invention provides an LED lens for a backlight, including an LED light source; a lens body configured such that the LED light source is accommodated in the lower portion thereof, and light emitted from the LED light source is radiated in vertical and lateral directions of the lens body; and a beam shaping element fastened to the top of the lens body and configured to adjust light beams radiated through the upper surface of the lens body.

In the present invention, the beam shaping element is directly formed on the lens body.

Furthermore, the amount of light radiated in the vertical direction of the lens body is more than 10% of the amount of light emitted from the LED light source. It is preferred that the amount of light radiated in the vertical direction may be adjusted according to the requirements of a backlight. In more detail, when it is desired to reduce the thickness of a backlight, the amount of light is adjusted to approach 10% of the amount of the emitted light. When it is desired to increase the efficiency of backlight luminance, the amount of light radiated in the vertical direction is adjusted to increase.

Furthermore, the lens body applied in the present invention includes a lower body configured to accommodate the LED light source in the lower portion thereof and to have a lower refracting surface formed to be symmetrical with respect to a central axis oriented in the vertical direction; and an upper body formed on the lower body, and configured to be provided with an upper refracting surface linearly connected to the front end of the lower refracting surface, and an upper reflecting surface disposed to be symmetrical from the front end of the upper refracting surface toward the central axis and form a predetermined angle.

Furthermore, the upper body further includes an upper transmitting surface formed in the central portion of the upper reflecting surface, and configured to directly radiate a potion of light emitted from the LED light source in the vertical direction.

Furthermore, the lens body of the present invention further includes a lower body configured to accommodate the LED light source in the lower portion thereof and to have a lower refracting surface formed to be symmetrical to a central axis oriented in the vertical direction; and an upper body formed on the lower body, and configured to have an upper refracting surface linearly connected to the front end of the lower refracting surface, and an upper transmitting surface formed to laterally extend from the front end of the upper refracting surface toward the central axis.

Furthermore, the beam shaping element of the present invention is fastened by a combination of a plurality of protrusions and a plurality of depressions along the front end of the upper refracting surface.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Preferred embodiments of the present invention are described with reference to the accompanying drawings below.

Figure 1:
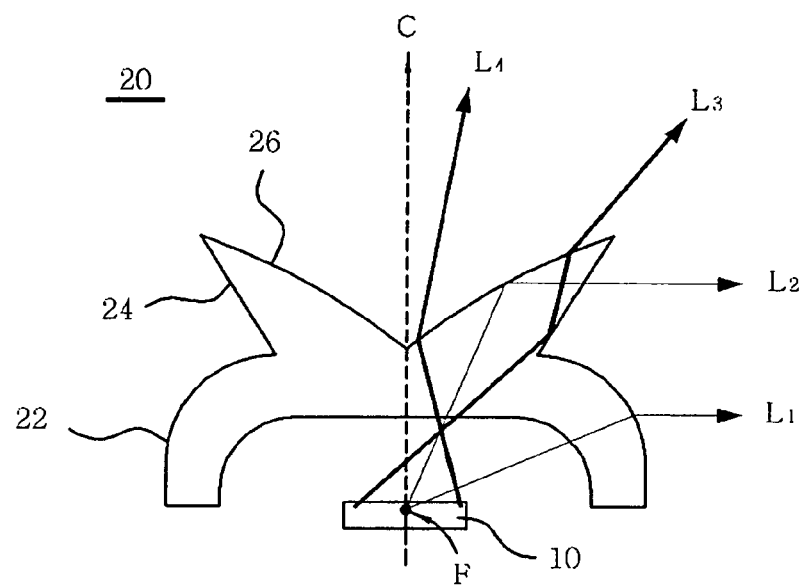
FIG. 1 is a diagram showing an example of a conventional LED lens.
Figure 2:
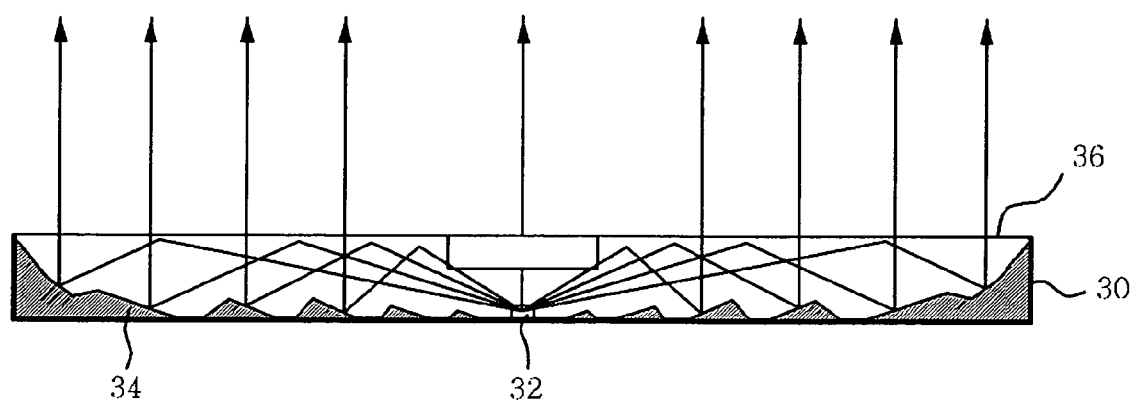
FIG. 2 is a diagram showing another example of a conventional LED lens.
Figure 3:
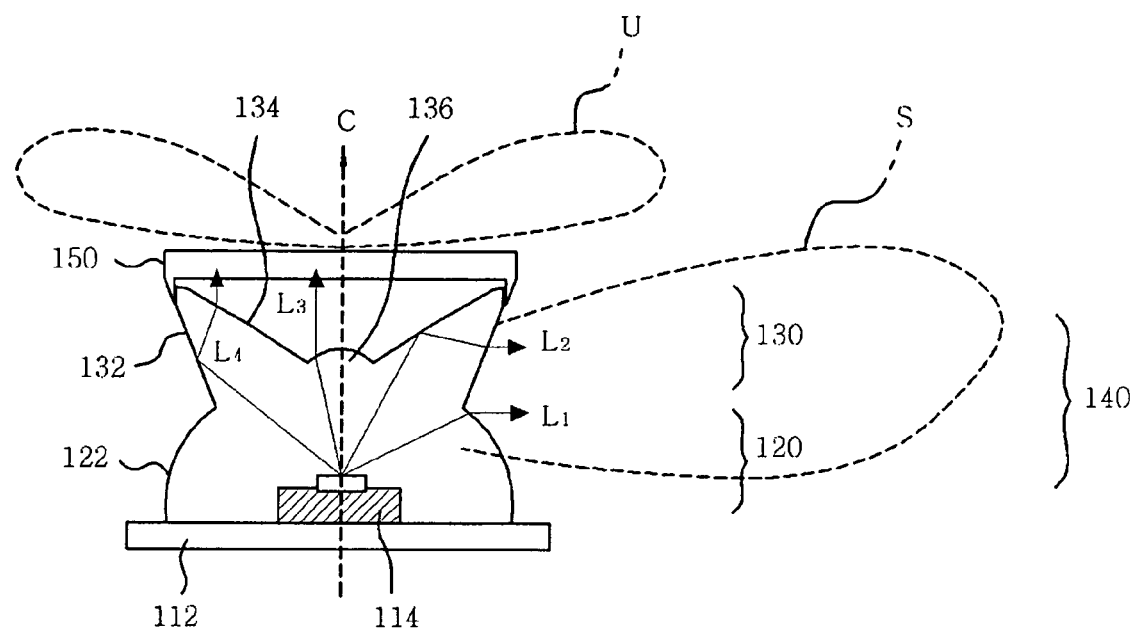
FIG. 3 is a diagram showing an LED lens according to an embodiment of the present invention.

FIG. 3 is a diagram showing an LED lens according to an embodiment of the present invention. The LED lens of FIG. 3 includes an LED light source 114 formed on a substrate 112, a lower body 120 configured to accommodate the LED light source in the lower portion thereof, an upper body 130 formed on the lower body, and a beam shaping element 150 fastened to the top of the upper body 130.

The lower body 120 accommodates the LED light source 114 in the lower portion thereof, and has a lower refracting surface 122 that is formed to be symmetrical with respect to a central axis C. An upper refracting surface 132 is connected to the front end of the lower refracting surface 122 to be symmetrical with respect to the central axis C, and an upper reflecting surface 134 is disposed to form a predetermined angle from the front end of the upper refracting surface 132 toward the central axis C. The upper reflecting surface 134 is disposed to be symmetrical with respect to the central axis C and form a predetermined angle, so that the lens is constructed to reflect light, which is oriented in a vertical direction of the lens, in a TIR fashion.

Furthermore, according to a feature of the present invention, a dome-shaped upper transmitting surface 136 is formed in the central portion of the upper reflecting surface 134, and a portion of the light emitted from the LED light source 114 may be directly radiated through the upper transmitting surface 136 in the vertical direction of the lens body 140.

It is preferred that the upper transmitting surface 136 be constructed such that the amount of light radiated in the vertical direction falls within a range of about 10% to 50% of the amount of light emitted from the LED light source 114.

In addition, the LED lens 110 according to a feature of the present invention further includes a beam shaping element 150 fastened to the top of the upper body 130 along the front end of the upper refracting surface 132. The beam shaping element 150 adjusts the radiation angle of the light radiated in the vertical direction, so that it may be constructed such that the orientation angle and distribution effect of the light are maximized at the upper surface of the lens body.

As shown in FIG. 3, the LED lens 110, having such a structure, may radiate light beams radiated in a lateral direction (light beams included in the dotted line region indicated by reference character S in FIG. 3) and light beams radiated in a vertical direction (light beams included in the dotted line region indicated by reference character U in FIG. 3). That is, the LED lens 110 according to a feature of the present invention combines the characteristics of the conventional side-emitting lens with the characteristics of the conventional upper-emitting lens, thus overcoming the conventional problems of non-uniform of luminance and color.

In more detail, a portion of the light emitted from the LED light source may be radiated through the lower refracting surface 122 in the lateral direction (L1), a portion of the light may be radiated through the upper refracting surface 132 in the lateral direction (L2), and a portion of the light emitted from the LED light source may be radiated through the upper transmitting surface 136 in the vertical direction (L3). Furthermore, light, which exists as unwanted erroneous light, is oriented in the vertical direction of the lens and is then radiated through the beam shaping element 150 (L4).

In this manner, the LED lens of the present invention is characterized in that it eliminates the erroneous light which is generated in the conventional structure, which restricts light to being radiated in the vertical direction and performs adjustment according to the intended purpose of the light radiated in the vertical direction, so that light regarded as erroneous light can also be used effectively and, therefore, the performance of the overall system can be improved.

Figure 4A:
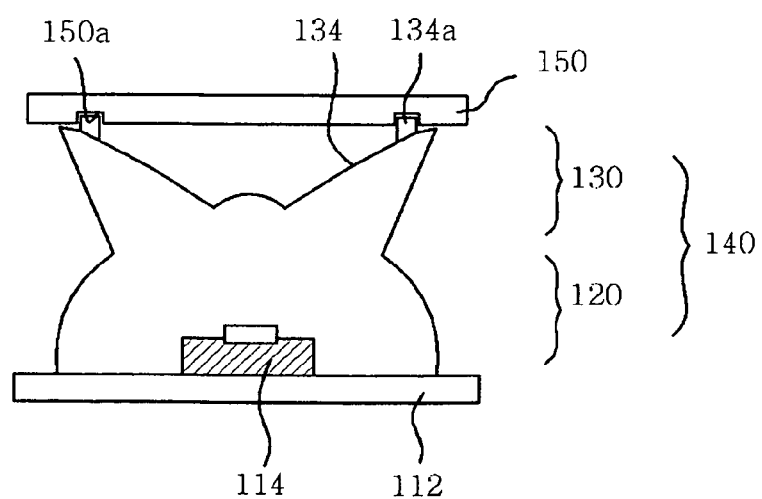
FIGS. 4A and 4B are sectional views showing examples in which the beam shaping element of FIG. 3 is fastened to the top of a lens body.
Figure 4B:
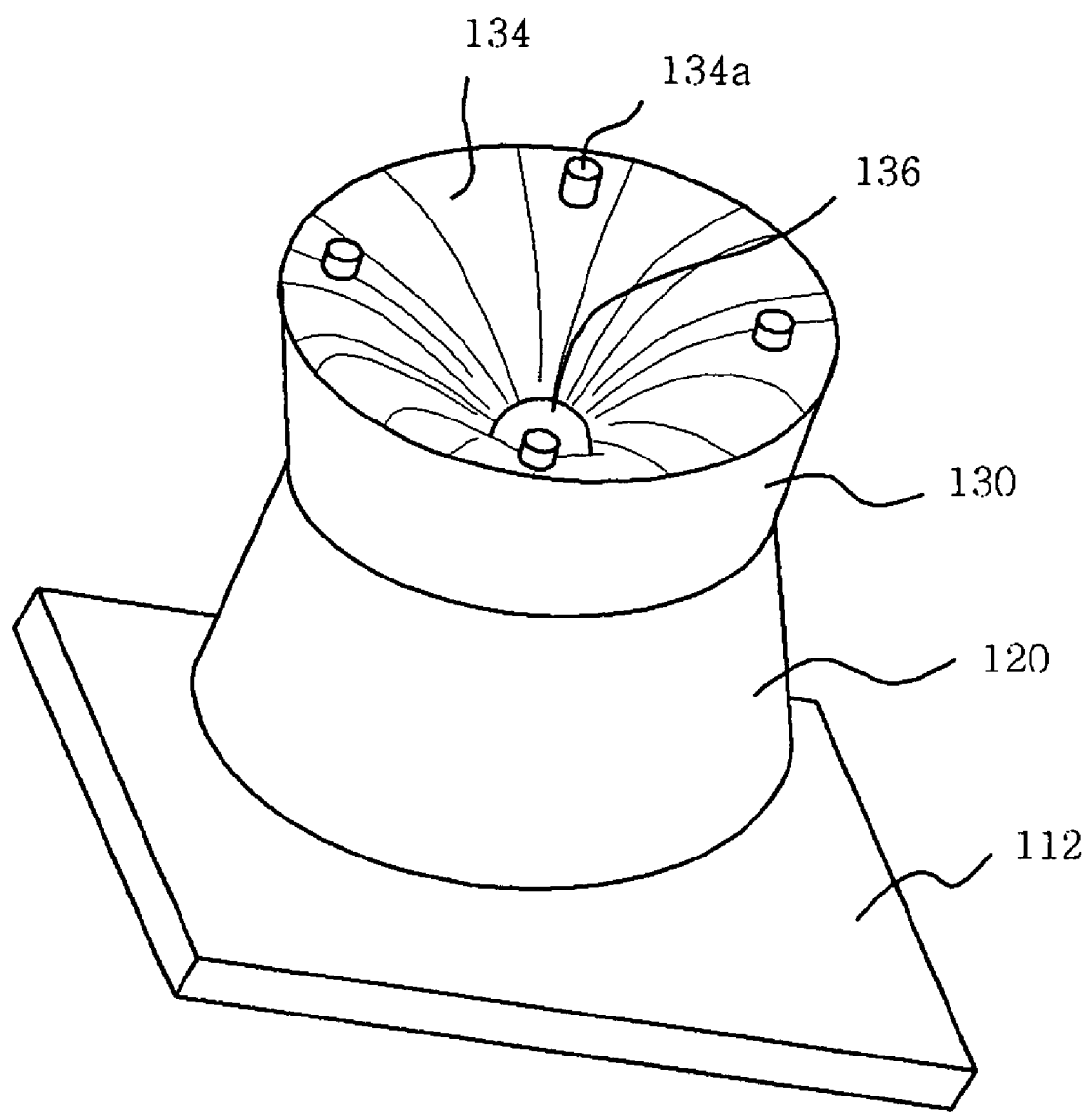

FIGS. 4A and 4B are sectional views showing examples in which the beam shaping element of FIG. 3 is fastened to the top of the lens body. Although, in FIG. 3, the state in which the beam shaping element is fastened along the front end of the upper body (for example, the front end of the upper refracting surface) is schematically shown, it is preferred that the beam shaping element be constructed so as to be fastened by the combination of a plurality of depressions 150a and a plurality of protrusions 134a, as shown in FIG. 4.

For example, as shown in FIG. 4, the plurality of protrusions 134a is formed at predetermined locations on the upper reflecting surface 134, and the plurality of depressions 15a, which correspond to respective protrusions 134a, is formed in the lower portion of the beam shaping element 150 which is desired to be fastened, so that the depressions and the protrusions can be used as fastening means. Although, in the example of FIG. 4, the protrusions are formed on the upper reflecting surface 134 and the depressions are formed in the lower portion of the beam shaping element 150, it is apparent that the reverse thereof is possible.

Furthermore, it should be noted that the fastening structure of FIG. 4, which is proposed as an embodiment of the present invention, may be implemented by varying the number of protrusions, the locations of formed protrusions, and the shapes of the protrusions, under the condition that the beam shaping element is fastened to the top of the upper body.

Figure 5:
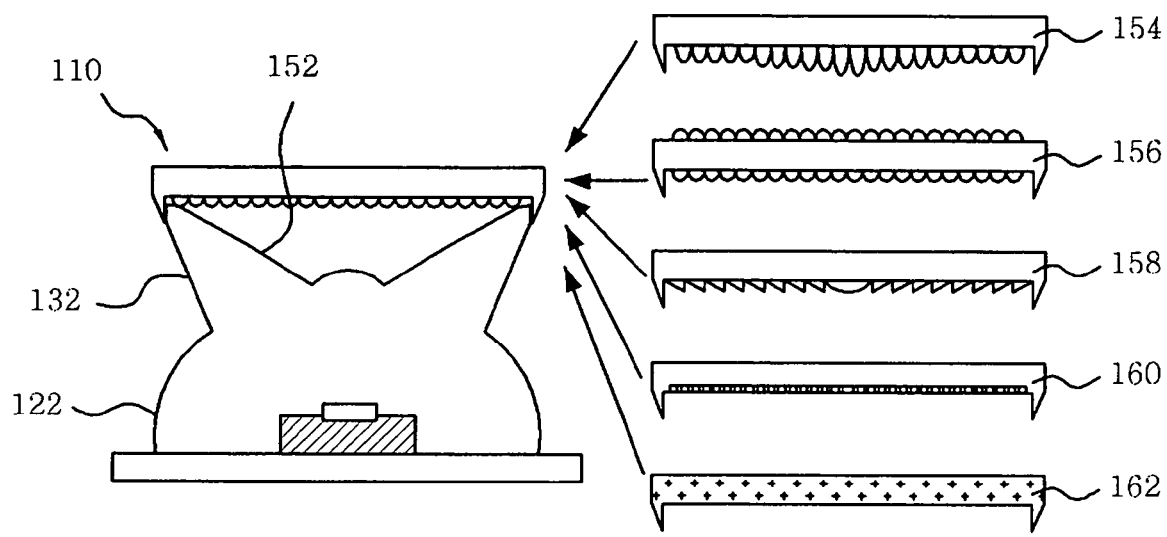
FIG. 5 is a diagram schematically showing various types of beam shaping elements fastened to the LED lens of FIG. 3.

FIG. 5 is a diagram schematically showing various types of beam shaping elements fastened to the LED lens of FIG. 3. As shown in FIG. 5, a microlens 152, a microlens array 154, a microlens pair 156, a Diffraction Optical Element (DOE) 158 (or a DOE pair), a diffuser 160 (or a diffuser pair), and a volume diffuser 162 may be used as the beam shaping element applied to the present invention. Each of the beam shaping elements adjusts the radiation angle of light radiated in the vertical direction of the lens, and thus can play the role of increasing the uniformity of the overall system.

That is, light traveling straight in the vertical direction of the lens body passes through the beam shaping element and forms a light region having a shape such that the light is laterally extended on the basis of the central axis of the lens, like the region U of FIG. 3, so that luminance is prevented from being concentrated on the central axis of the lens, therefore the overall uniformity of luminance and color can be increased in the system.

Furthermore, lens bodies having various shapes may be used as the LED lens of the present invention. Unlike the lens body 140 of FIG. 3, lens bodies having various shapes may be applied, the schemes of which are described with reference to FIGS. 6A to 6C.

Figure 6A:
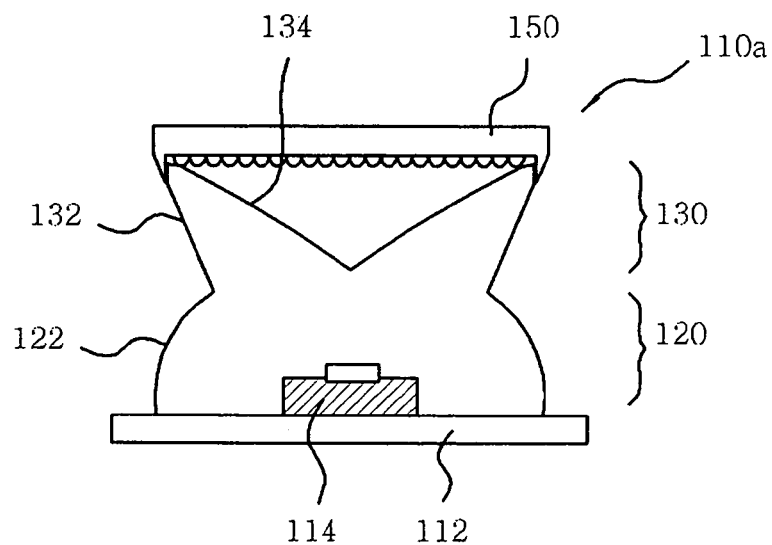
FIGS. 6A to 6C are diagrams showing various types of lens bodies applied to the present invention.
Figure 6B:
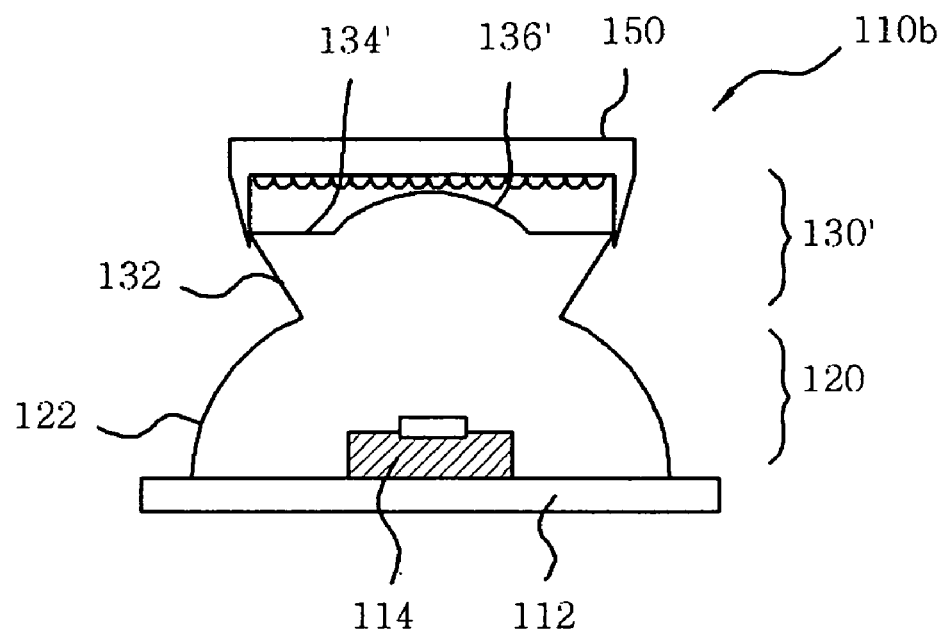
Figure 6C:
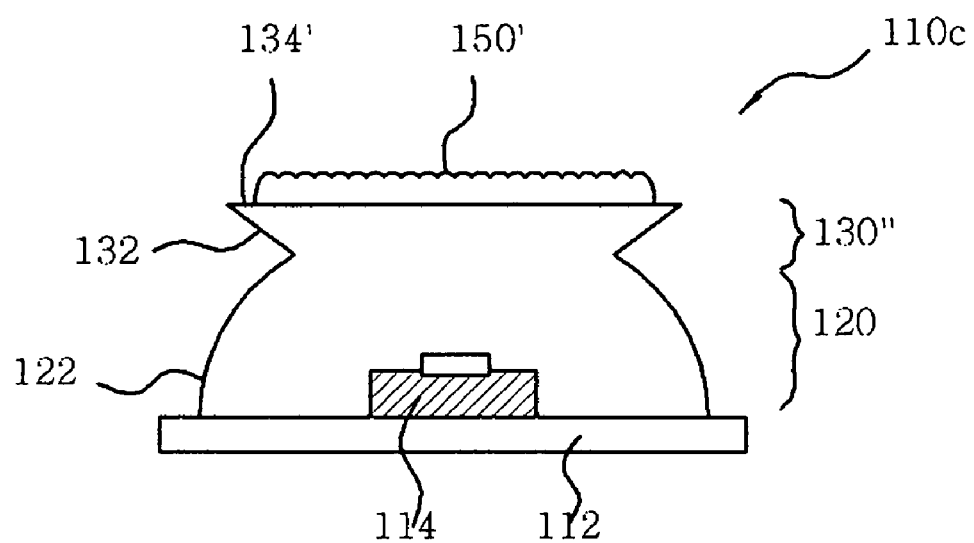

For reference, the lenses 110a, 110b and 110c of FIGS. 6A to 6C are basically similar to the lens 110 of FIG. 3, therefore the same components are indicated by the same reference character, and detailed descriptions thereof are omitted.

For example, the lens 110a of FIG. 6A is realized by removing the upper transmitting surface 136 (with reference to FIG. 3) from the lens body of FIG. 3, the lens 110b of FIG. 6B is realized by forming a flat-type upper transmitting surface 134' instead of the upper reflecting surface 134 (with reference to FIG. 3) and a central refracting surface 136' formed in the central portion of the upper transmitting surface 134', and the lens 110c of FIG. 6C is realized by forming a beam shaping means 150' on the flat-type upper transmitting surface 134'.

As described above, the LED lens for a backlight according to the present invention is characterized in that it can be constructed from a combination of lens bodies 110, 110a, 110b and 110c, having various shapes, and various types of beam shaping elements 150, 152, 154, 156, 158, 160 and 162, and radiates light emitted from an LED light source in both lateral and vertical directions of the lens.

In this manner, the LED lens of the present invention can increase the overall luminance by radiating a portion of the light, which is emitted from the LED light source, in the vertical direction of the lens and, at the same time, can improve the uniformity of the system by radiating a portion of the light in the lateral direction of the lens and illuminating a maximally wide area.

Although the amount of light emitted in the vertical direction of the lens may vary according to the shape, intended use, and construction of a lens, a range from about 10% to 50% of the light emitted from the LED light source may be used. In this case, the adjustment of the amount of light may be made according to the shape of lens body (main lens).

As described above, the LED lens for a backlight according to the present invention radiates light in the lateral and vertical directions of the lens, thus resulting in the following features:

First, luminance can be improved compared to the conventional side-emitting lens. The amount of power consumed and the amount of heat generated can be reduced according to the improvement in the luminance.

Furthermore, the uniformity of luminance and color can be increased compared to the conventional upper-emitting lens. Accordingly, the thickness of the overall system can be reduced.

In addition, the LED lens according to the present invention even controls erroneous light, thus contributing to the improvement of the performance of the overall system.

As described above, the LED lens for a backlight according to the present invention radiates light, which is emitted from the LED light source, in lateral and vertical directions of the lens, thus improving the overall luminance and realizing the uniformity of luminance and color. In addition, the LED lens controls erroneous light, thus contributing to the improvement of the overall performance of the system.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A Light Emitting Diode (LED) lens for a backlight, comprising:
    a LED light source;
    a lens body configured such that the LED light source is accommodated in a lower portion thereof, and light emitted from the LED light source is radiated in vertical and lateral directions of the lens body; and
    a beam shaping element fastened to a top of the lens body and configured to adjust radiation angles of light beams radiated through an upper surface of the lens body;
    wherein, the lens body emits a major portion of the LED light in lateral direction and a minor portion of the LED light in vertical direction, and the lens body has a dome-shaped surface thereon to collimate the minor portion of the LED light toward the beam shaping element.

2. The LED lens as set forth in claim 1, wherein the beam shaping element is directly fastened on the lens body.

3. The LED lens as set forth in claim 1, wherein an amount of light radiated in the vertical direction of the lens body is more than 10% of an amount of light emitted from the LED light source.

4. The LED lens as set forth in claim 1, wherein the lens body comprises:
    a lower body configured to accommodate the LED light source in a lower portion thereof and to have a lower refracting surface formed to be symmetrical with respect to a central axis oriented in the vertical direction; and
    an upper body formed on the lower body, and configured to be provided with an upper refracting surface linearly connected to a front end of the lower refracting surface, and an upper reflecting surface disposed to be symmetrical from a front end of the upper refracting surface toward the central axis and form a predetermined angle.

5. The LED lens as set forth in claim 4, wherein the upper body has a dome-shaped upper transmitting surface formed in a central portion of the upper reflecting surface, and configured to directly radiate a potion of light emitted from the LED light source in the vertical direction.

6. The LED lens as set forth in claim 1, wherein the lens body further comprises:
a lower body configured to accommodate the LED light source in a lower portion thereof and to have a lower refracting surface formed to be symmetrical to a central axis oriented in the vertical direction; and
an upper body formed on the lower body, and configured to have an upper refracting surface linearly connected to a front end of the lower refracting surface, and an upper transmitting surface formed to laterally extend from the front end of the upper refracting surface toward the central axis.

7. The LED lens as set forth in claim 4, wherein a plurality of protrusions are formed at predetermined locations on the upper reflecting surface, and a plurality of depressions corresponding to the plurality of protrusions are formed in the lower portion of the beam shaping element to fasten the beam shaping element to the lens body.

8. The LED lens as set forth in claim 4 or 6, wherein the beam shaping element forms a light region in which the light is laterally extended with respected to the central axis of the lens body.

9. The LED lens as set forth in claim 4 or 6, wherein the beam shaping element is fastened along the front end of the upper refracting surface.

10. The LED lens as set forth in claim 6, wherein the upper body has a dome-shaped central refracting surface formed in a central portion of the upper transmitting surface.

* * * * *